United States Patent
Nishimura et al.

(10) Patent No.: US 8,034,720 B2
(45) Date of Patent: Oct. 11, 2011

(54) SUBSTRATE PROCESSING METHOD AND SUBSTRATE PROCESSING APPARATUS

(75) Inventors: Eiichi Nishimura, Nirasaki (JP); Chie Kato, Nirasaki (JP); Jun Yamawaku, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 862 days.

(21) Appl. No.: 12/014,540

(22) Filed: Jan. 15, 2008

(65) Prior Publication Data

US 2008/0179292 A1    Jul. 31, 2008

Related U.S. Application Data

(60) Provisional application No. 60/911,677, filed on Apr. 13, 2007.

(30) Foreign Application Priority Data

Jan. 31, 2007  (JP) .................................. 2007-021020

(51) Int. Cl.
*H01L 21/302* (2006.01)
(52) U.S. Cl. ........... 438/706; 438/714; 438/724; 216/73
(58) Field of Classification Search .................. 438/706, 438/710, 719, 723, 712, 714; 216/58, 73.79, 216/73, 79
See application file for complete search history.

(56) References Cited

U.S. PATENT DOCUMENTS

| 6,451,713 | B1 * | 9/2002 | Tay et al. ........................ 438/791 |
| 2002/0073923 | A1 * | 6/2002 | Saito et al. .................... 118/715 |
| 2004/0018683 | A1 * | 1/2004 | Kim et al. ..................... 438/257 |
| 2005/0074948 | A1 * | 4/2005 | Ko et al. ........................ 438/424 |

FOREIGN PATENT DOCUMENTS

| JP | 05-041367 | 2/1993 |
| JP | 2001-345307 | 12/2001 |
| JP | 2003-264183 | 9/2003 |

OTHER PUBLICATIONS

Office Action issued Jun. 1, 2011, in Japanese Patent Application No. 2007-021020 filed Apr. 13, 2007 (with English-language Translation).

* cited by examiner

*Primary Examiner* — Lan Vinh
(74) *Attorney, Agent, or Firm* — Oblon, Spivak, McClelland, Maier & Neustadt, L.L.P.

(57) ABSTRACT

A substrate processing method that can remove a silicon nitride film without damaging a thermally-oxidized film. A substrate having at least a thermally-oxidized film and a silicon nitride film formed on the thermally-oxidized film is heated to a temperature of not less than 60° C. Then, hydrogen fluoride gas is supplied toward the substrate.

7 Claims, 6 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus, and in particular to a method of processing a substrate having a silicon nitride film and a thermally-oxidized film.

2. Description of the Related Art

Wafers as substrates are known that have a thermally-oxidized film formed on a single-crystal silicon base material, and a silicon nitride (SiN) film formed on the thermally-oxidized film. For such wafers, it may be required to remove only the silicon nitride film without removing the thermally-oxidized film.

In general, as methods of removing the silicon nitride film, wet etching using hot phosphoric acid and dry etching using plasma produced from chemical compound gas are known (see, for example, Japanese Laid-Open Patent Publication (Kokai) No. 2003-264183).

However, through the wet etching using hot phosphoric acid and the dry etching using plasma, it is difficult to secure the selective ratio of the silicon nitride film to the thermally-oxidized film, and as a result, not only the silicon nitride film but also the thermally-oxidized film may be etched, causing damage to the thermally-oxidized film.

SUMMARY OF THE INVENTION

The present invention provides a substrate processing method and a substrate processing apparatus that can remove a silicon nitride film without damaging a thermally-oxidized film.

Accordingly, in a first aspect of the present invention, there is provided a substrate processing method of processing a substrate having at least a thermally-oxidized film and a silicon nitride film formed on the thermally-oxidized film, comprising a heating step of heating the substrate to a temperature of not less than 60° C. and a gas supply step of supplying hydrogen fluoride gas toward the substrate.

According to the first aspect of the present invention, a substrate having at least a thermally-oxidized film and a silicon nitride film formed on the thermally-oxidized film is heated to a temperature of not less than 60° C., and hydrogen fluoride gas is supplied toward the substrate. When the substrate reaches a temperature of not less than 60° C., the silicon nitride film is suddenly etched by the hydrogen fluoride gas although the thermally-oxidized silicon film is not etched by the hydrogen fluoride gas. Thus, the selective ratio of the silicon nitride film to the thermally-oxidized silicon film can be secured, and hence the silicon nitride film can be removed without damaging the thermally-oxidized silicon film.

The present invention can provide a substrate processing method, wherein in the gas supply step, the supplied hydrogen fluoride gas reaches the substrate without turning into plasma.

According to the first aspect of the present invention, because in the gas supply step, the supplied hydrogen fluoride gas reaches the substrate without turning into plasma, the thermally-oxidized silicon film can be prevented from being damaged by plasma.

The present invention can provide a substrate processing method, wherein in the heating step, the substrate is maintained at a temperature of not more than 200° C.

According to the first aspect of the present invention, the substrate is maintained at a temperature of not more than 200° C. in the heating step. When the temperature of the substrate rises, the etch rate at which the silicon nitride film is etched by the hydrogen fluoride gas decreases, and when the temperature of the substrate reaches 200° C., the etch rate of the silicon nitride film becomes nearly zero. Thus, by maintaining the substrate at a temperature of not more than 200° C., the etch rate of the silicon nitride film can be maintained at more than zero, and hence the selective ratio of the silicon nitride film to the thermally-oxidized silicon film can be reliably secured.

The present invention can provide a substrate processing method, wherein in the heating step, the substrate is heated to a temperature of 80 to 120° C.

According to the first aspect of the present invention, the substrate is heated to a temperature of 80 to 120° C. in the heating step. When the substrate reaches a temperature of not less than 60° C., the etch rate at which the silicon nitride film is etched by the hydrogen fluoride gas suddenly changes, and hence it is difficult to control the etch rate when the temperature of the substrate is in the vicinity of 60° C. On the other hand, when the temperature of the substrate is 80 to 120° C., the etch rate of the silicon nitride film gradually changes. Thus, by heating the substrate to 80 to 120° C., changes in the etch rate of the silicon nitride film can be suppressed, and hence the etch rate of the silicon nitride film can be easily controlled.

The present invention can provide a substrate processing method, wherein in the gas supply step, the hydrogen fluoride gas is supplied toward the substrate for at least 30 seconds.

According to the first aspect of the present invention, the hydrogen fluoride gas is supplied toward the substrate for at least 30 seconds in the gas supply step. Even when the substrate is heated to a temperature of not less than 60° C., etching of the silicon nitride film is not started until 30 seconds has elapsed since the substrate contacted the hydrogen fluoride gas. Thus, by supplying the hydrogen fluoride gas toward the substrate for at least 30 seconds, the silicon nitride film can be reliably etched.

Accordingly, in a second aspect of the present invention, there is provided a substrate processing apparatus that processes a substrate having at least a thermally-oxidized film and a silicon nitride film formed on the thermally-oxidized film comprising a housing chamber in which the substrate is housed, a mounting stage that is disposed in the housing chamber and on which the substrate is mounted, and a gas supply device that supplies hydrogen fluoride gas toward the substrate mounted on said mounting stage, wherein the mounting stage comprises a heating device that heats the mounted substrate to a temperature of not less than 60° C.

The features and advantages of the invention will become more apparent from the following detailed description taken in conjunction with the accompanying drawings.

DETAILED DESCRIPTION OF THE PREFERRED EMBODIMENTS

The present invention will now be described in detail below with reference to the drawings showing a preferred embodiment thereof.

First, a description will be given of a substrate processing apparatus according to an embodiment of the present invention.

Figure 1:
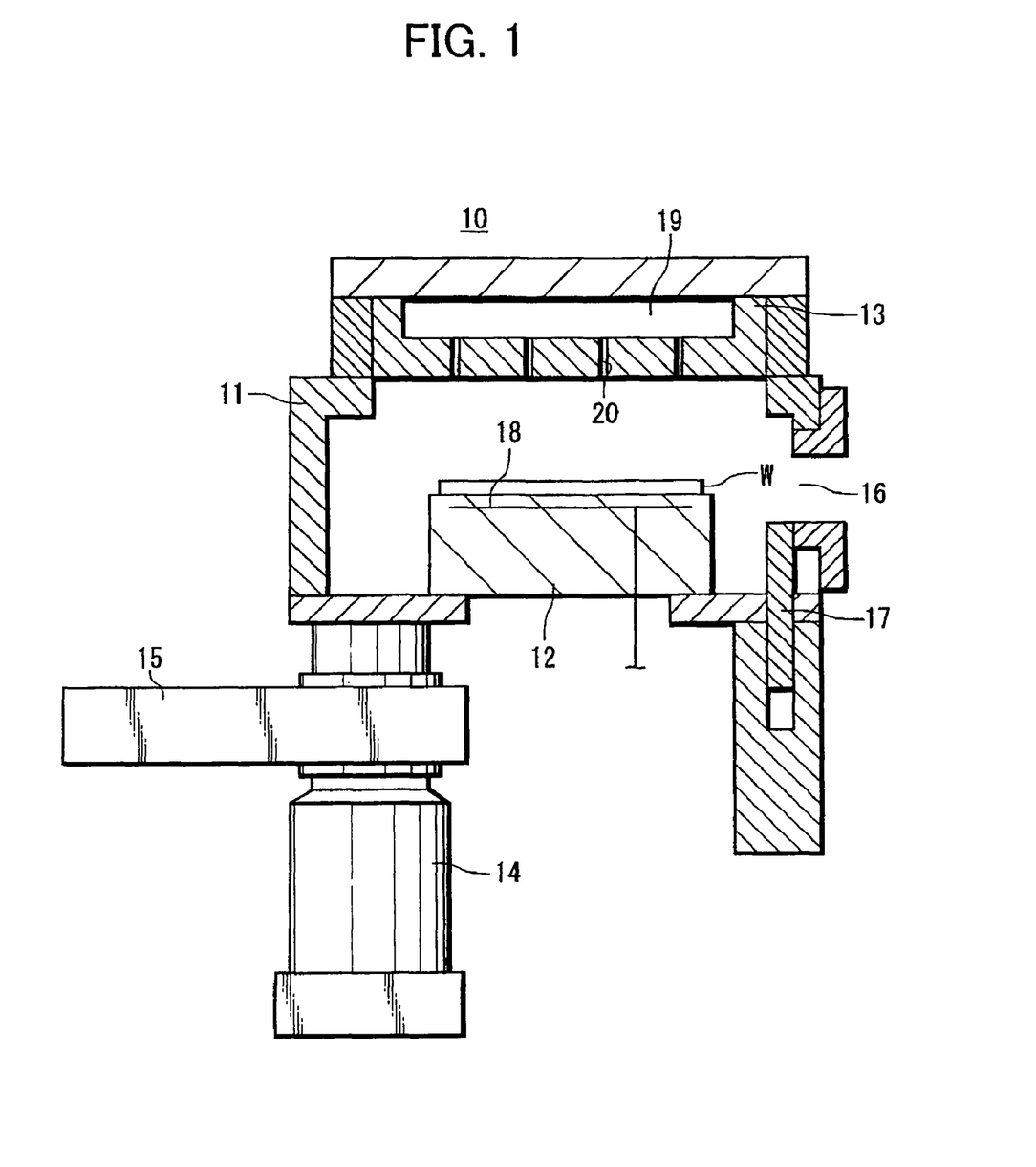
FIG. 1 is a sectional view schematically showing the construction of a substrate processing apparatus according to an embodiment of the present invention.

FIG. 1 is a sectional view schematically showing the construction of a substrate processing apparatus according to the present embodiment.

As shown in FIG. 1, the substrate processing apparatus 10 has a wafer housing chamber (hereinafter merely referred to as the "chamber") 11 in which a disk-shaped semiconductor wafer (hereinafter merely referred to as a "wafer") W is housed, a mounting stage 12 that is disposed in the chamber 11 and on which the wafer W is mounted, a shower head 13 (gas supply device) that is disposed in an upper portion of the chamber 11 such as to face the mounting stage 12, a TMP (turbo-molecular pump) 14 that exhausts gas and the like out of the chamber 11, and an APC (adaptive pressure control) valve 15 that is disposed between the chamber 11 and the TMP 14 as a variable butterfly valve for controlling the pressure in the chamber 11.

The chamber 11 is a housing chamber having a side wall, a ceiling portion, and a bottom portion made of aluminum or the like. A transfer port 16 for transferring the wafers W is provided in the side wall of the chamber 11. The transfer port 16 is opened and closed by a sliding gate 17.

The mounting stage 12 is comprised of a cylindrical aluminum member, and the diameter thereof is set to be larger than that of the wafer W. Thus, when the wafer W is mounted on the mounting stage 12, the entire rear surface of the wafer W contacts an upper surface (mounting surface) of the mounting stage 12. The mounting stage 12 has therein a heater 18, which is disposed parallel to the mounting surface of the mounting stage 12. When the heater 18 generates heat, the entire surface of the wafer W is uniformly heated because the entire rear surface of the wafer W contacts the mounting surface. As a result, the amount of etching of a silicon nitride film 23 using hydrogen fluoride, described later, can be made uniform over the entire surface. It should be noted that the heater 18 is able to heat the mounted wafer W to a temperature of not less than 60° C.

The shower head 13 is comprised of a disk-shaped aluminum member and has a buffer chamber 19 therein. The buffer chamber 19 communicates with the interior of the chamber 11 via a plurality of gas vent holes 20. The buffer chamber 19 of the shower head 13 is connected to a hydrogen fluoride (HF) gas supply system (not shown). The hydrogen fluoride gas supply system supplies hydrogen fluoride gas into the buffer chamber 19. The supplied hydrogen fluoride gas is supplied into the chamber 11 and also toward the wafer W via the gas vent holes 20.

In the substrate processing apparatus 10, the side wall of the chamber 11 also has a heater (not shown), for example, a heating element incorporated therein. The heating element inside the side wall prevents $SiF_4$ (silicon tetrafluoride) or the like, described later, subliming from the wafer W from becoming attached to an inner side of the side wall.

Figure 2:
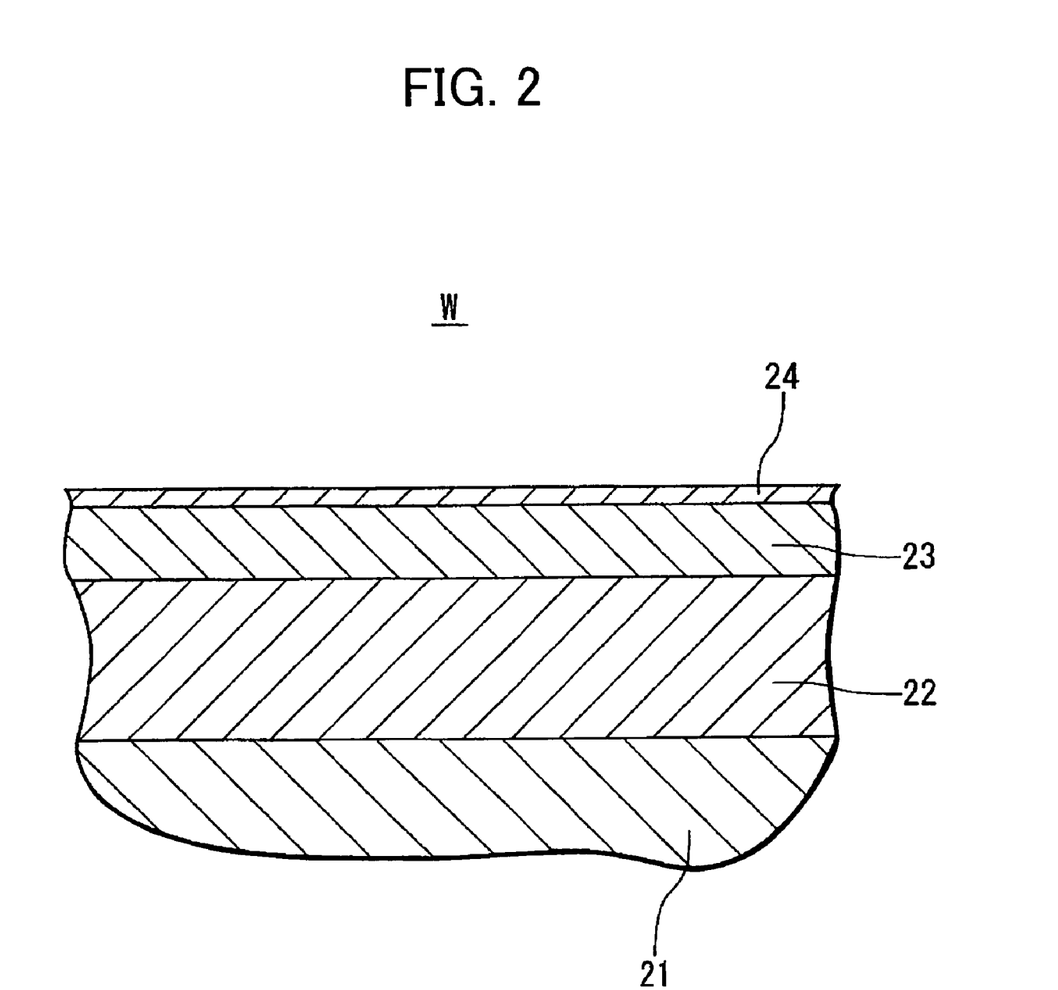
FIG. 2 is a sectional view schematically showing the cross-section structure of a wafer to which a substrate processing method according to the above embodiment is applied.

FIG. 2 is a sectional view schematically showing the cross-section structure of a wafer to which a substrate processing method according to the present embodiment is applied.

As shown in FIG. 2, a wafer W has a disk-shaped single-crystal silicon base material 21, a thermally-oxidized silicon film 22 (thermally-oxidized film) formed on the single-crystal silicon base member 21 by thermal oxidation processing, a silicon nitride (SiN) film 23 formed on the thermally-oxidized silicon film 22 by CVD (Chemical Vapor Deposition) processing, and a silicon monoxide (SiO) film 24 formed on the silicon nitride film 23 by natural oxidization.

The thermally-oxidized silicon film 22 is formed by the thermal oxidation processing in an environment at 800 to 900° C. and hence has a tight film structure. Also, the silicon monoxide film 24 is formed by thermal oxidation of the silicon nitride film 23, which is heated to a high temperature during the CVD processing, through reaction with oxygen ($O_2$) in the air, and hence the silicon monoxide film 24 has a tight film structure. On the other hand, the silicon nitride film 23 is formed by the CVD processing, i.e. vapor deposition and hence has a loose film structure.

The present inventors conducted various experiments on the wafer W shown in FIG. 2 so as to find out a processing method of selectively removing only the silicon nitride film 23 without carrying out wet etching using a chemical solution or dry etching using plasma, and found that etching of the silicon nitride film 23 using hydrogen fluoride gas is clearly temperature-dependent.

Specifically, the present inventors found that in etching the silicon nitride film 23 using hydrogen fluoride gas while changing the temperature of the wafer W, the etch rate (etching speed) of the silicon nitride film 23 suddenly changes upon reaching approximately 60° C. (the temperature of the wafer W).

Figure 3:
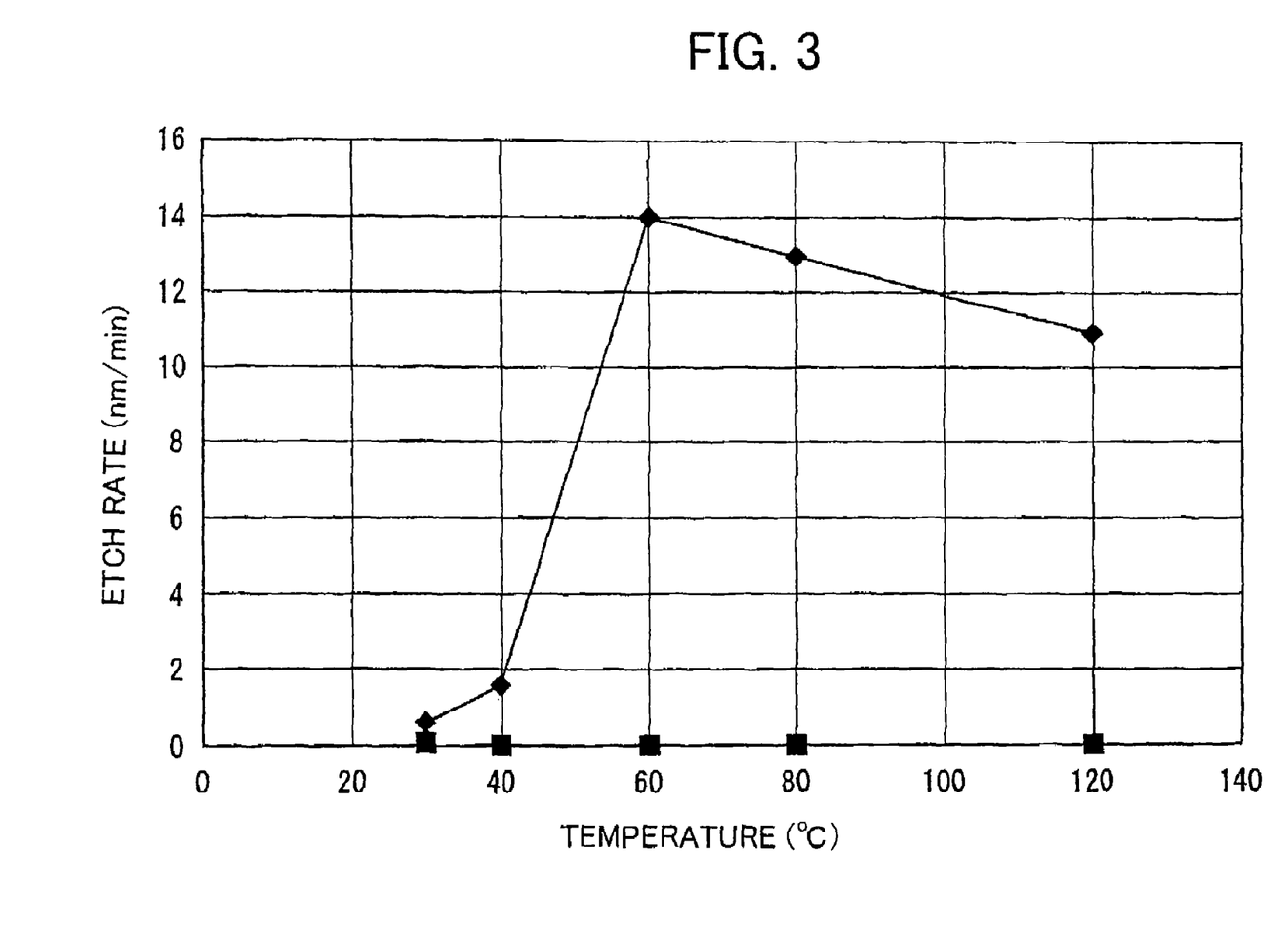
FIG. 3 is a graph showing the relationship between the etch rate at which a silicon nitride film and a thermally-oxidized nitride film are etched using hydrogen fluoride gas and the temperature of a wafer, which was ascertained by the present inventors through experiments.

FIG. 3 is a graph showing the relationship between the etch rate at which a silicon nitride film and a thermally-oxidized nitride film are etched using hydrogen fluoride gas and the temperature of a wafer, which was ascertained by the present inventors through experiments. In FIG. 3, the silicon nitride film is indicated by "♦", and the thermally-oxidized silicon film is indicated by "■." It should be noted that in experiments conducted by the present inventors, the pressure of an atmosphere in the vicinity of the wafer W was $4.00 \times 10^3$ (30 Torr), and the flow rate of supplied hydrogen fluoride gas was 3000 sccm.

As shown in FIG. 3, when the wafer W reached a temperature of not less than 60° C., the etch rate of the silicon nitride film 23 suddenly increased. Also, it was found that when the temperature of the wafer W further increases, the etch rate of the silicon nitride film 23 gradually decreases but does not suddenly change, and in particular, when the temperature of the wafer W is 80 to 120° C., the etch rate of the silicon nitride film 23 only gradually changes. It should be noted that although not shown in the graph of FIG. 3, the present inventors ascertained through experiments that the etch rate of the silicon nitride film 23 becomes nearly zero when the temperature of the wafer W reaches 200° C.

On the other hand, the present inventors ascertained that as shown in FIG. 3, the etch rate of the thermally-oxidized silicon film 22 is nearly zero irrespective of the temperature of the wafer W, and also ascertained that the etch rate of the single-crystal silicon base material 21 is nearly zero irrespective of the temperature of the wafer W although not shown in the graph of FIG. 3.

Here, the etch rate of the silicon nitride film 23 is not less than 10 nm/min when the temperature of the wafer W is 60 to 120° C., and hence it is apparent that the selective ratio of the silicon nitride film 23 to the thermally-oxidized silicon film 22 can be reliably made to be not less than 10 insofar as the temperature of the wafer W is maintained at 60 to 120° C.

It is difficult to clearly explain the mechanism by which the silicon nitride film 23 is etched using hydrogen fluoride gas, but the present inventors arrived at the following hypothesis.

That is, because the silicon nitride film 23 has a loose film structure, it tends to attract water molecules thereto. Thus, the silicon nitride film 23 contains a certain amount of water molecules. Hydrogen fluoride gas that has reached the silicon nitride film 23 combines with the water molecules to make hydrofluoric acid. The hydrofluoric acid chemically reacts with the silicon nitride film 23 as expressed by the following equation (1):

$$2SiN + 8HF \rightarrow 2SiF_4 + 4H_2\uparrow + N_2\uparrow \quad (1)$$

Here, because the chemical reaction expressed by the above equation (1) is promoted at 60° C. or higher, the present inventors assumed that the etch rate of the silicon nitride film 23 suddenly increases when the wafer W reaches a temperature of not less than 60° C.

The $SiF_4$ produced through the chemical reaction expressed by the above equation (1) chemically reacts with the hydrofluoric acid as expressed by the following equation (2) to make residue ($H_2SiF_6$):

$$SiF_4 + 2HF \rightarrow H_2SiF_6 \quad (2)$$

The residue causes a conduction error and the like of a semiconductor device and hence has to be removed from the wafer W. However, because the temperature of the wafer W is not less than 60° C., the residue is thermally decomposed through thermal energy as expressed by the following equation (3):

$$H_2SiF_6 + Q \text{ (thermal energy)} \rightarrow 2HF\uparrow + SiF_4\uparrow \quad (3)$$

On the other hand, the present inventors arrived at the following hypothesis regarding the mechanism by which the thermally-oxidized silicon film 22 is not etched by hydrogen fluoride gas.

That is, because the thermally-oxidized silicon film 22 has a tight film structure, it resists attracting water molecules thereto. Thus, the thermally-oxidized silicon film 22 contains few water molecules. Even when supplied hydrogen fluoride gas reaches the thermally-oxidized silicon film 22, the hydrogen fluoride gas never makes hydrofluoric acid because there are few molecules. As a result, the thermally-oxidized silicon film 22 is never etched by hydrofluoric acid.

Figure 4:
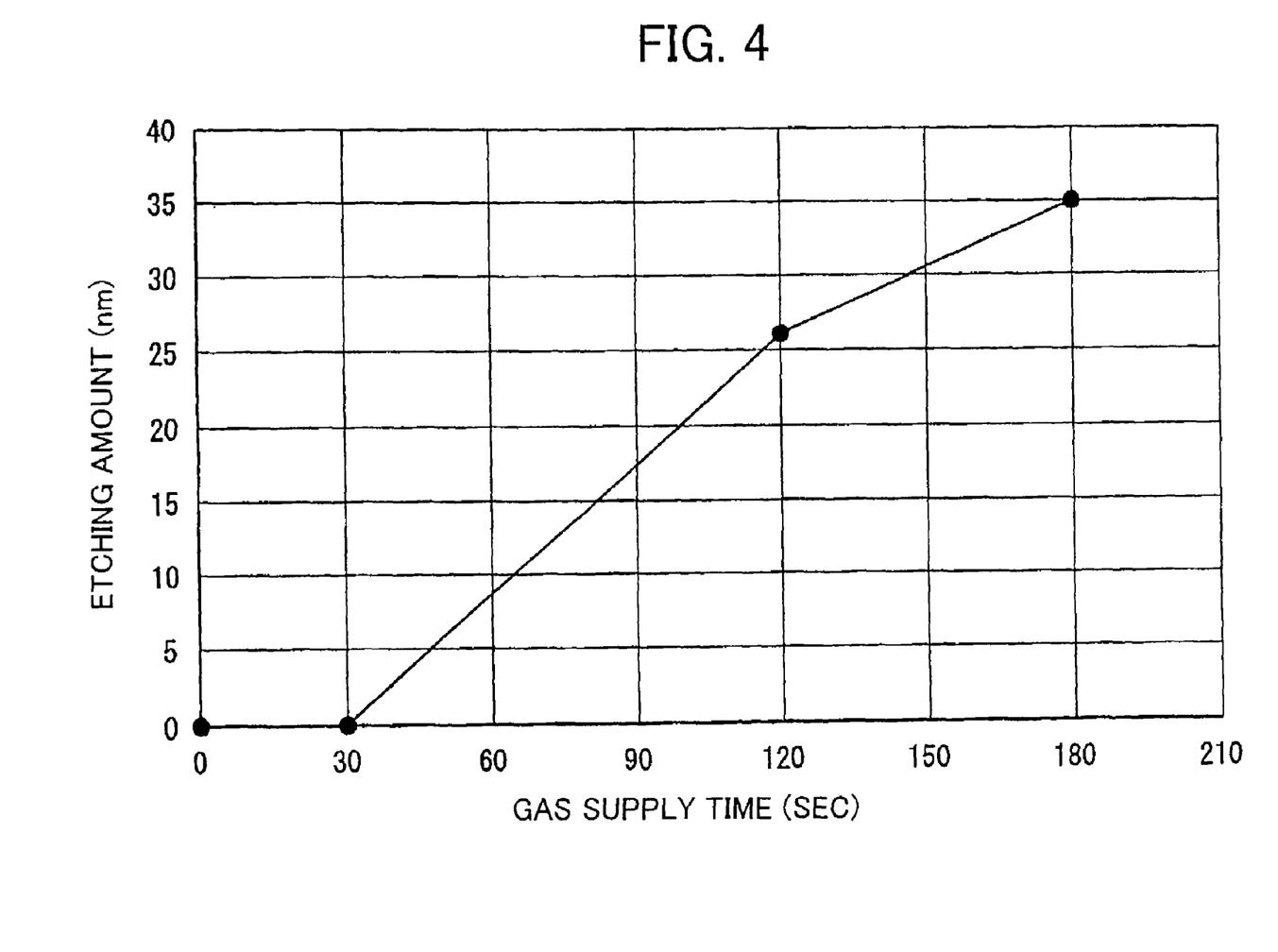
FIG. 4 is a graph showing the relationship between the length of time that hydrogen fluoride gas is supplied and the etching amount of a silicon nitride film, which was ascertained by the present inventors through experiments.

Moreover, the present inventors ascertained through experiments that in heating the wafer W and etching the silicon nitride film 23 using hydrogen fluoride, the silicon nitride film 23 is not immediately etched when the hydrogen fluoride gas is supplied toward the wafer W, but etching is started upon the lapse of a predetermined time period. Specifically, as shown by the graph of FIG. 4, etching of the silicon nitride film 23 was started upon the lapse of 30 seconds since the start of supply of hydrogen fluoride gas.

The present inventors arrived at the following hypothesis regarding the mechanism by which the silicon nitride film 23 is not immediately etched when hydrogen fluoride gas is supplied toward the wafer W.

That is, the silicon monoxide film 24, which is a thin film, is formed on the silicon nitride film 23 as shown in FIG. 2, but because the silicon monoxide film 24 has a tight film structure, it contains few water molecules. Thus, the silicon monoxide film 24 is not immediately etched when hydrogen fluoride gas is supplied. The time required for etching of the silicon monoxide film 24 is 30 seconds. Then, the silicon monoxide film 24 is removed, and etching of the silicon nitride film 23 is started.

Next, a description will be given of a substrate processing method according to the present embodiment.

Figure 5:
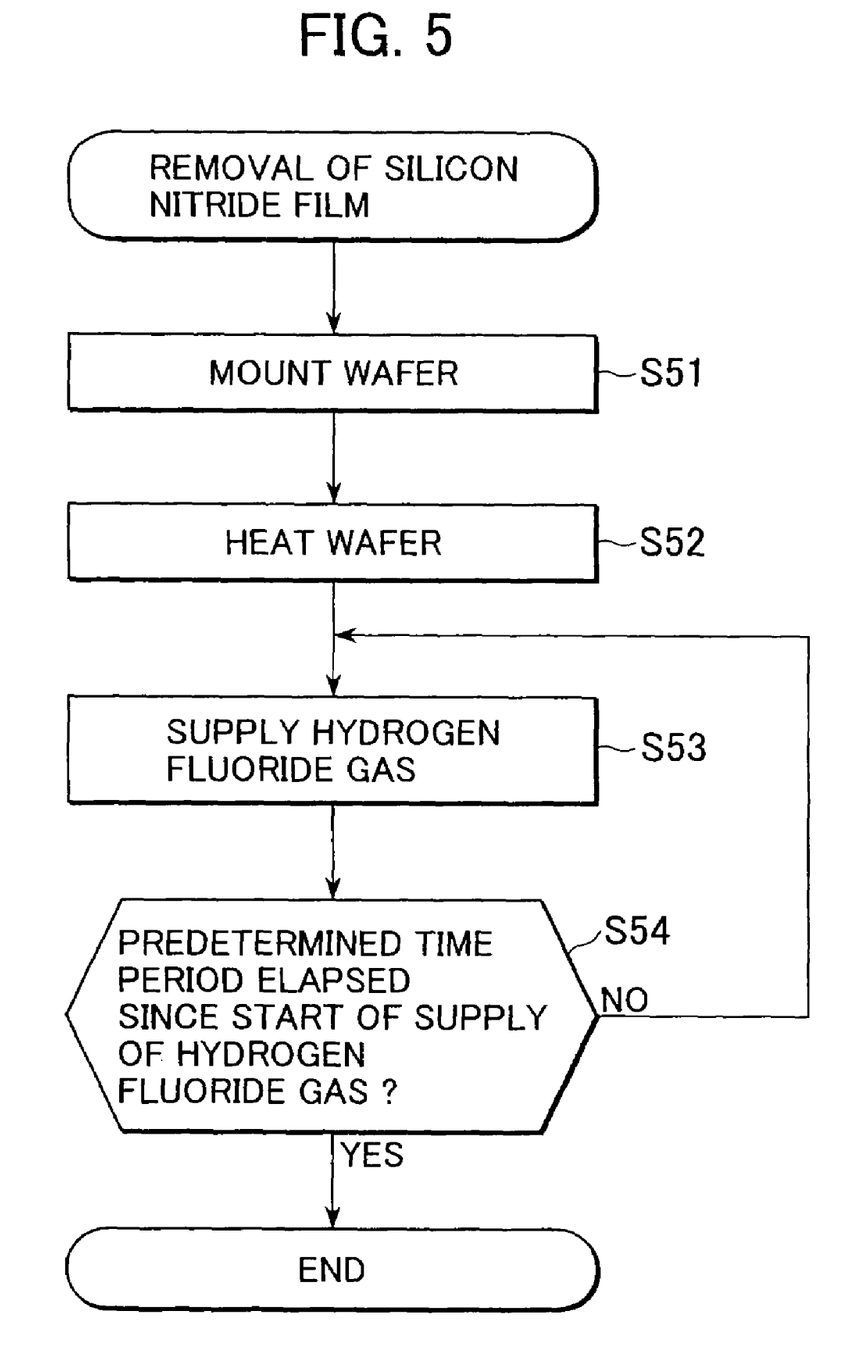
FIG. 5 is a flow chart of a silicon nitride film removing process as a substrate processing method according to the above embodiment.

FIG. 5 is a flow chart of a silicon nitride film removing process as the substrate processing method according to the present embodiment.

Figure 6A:
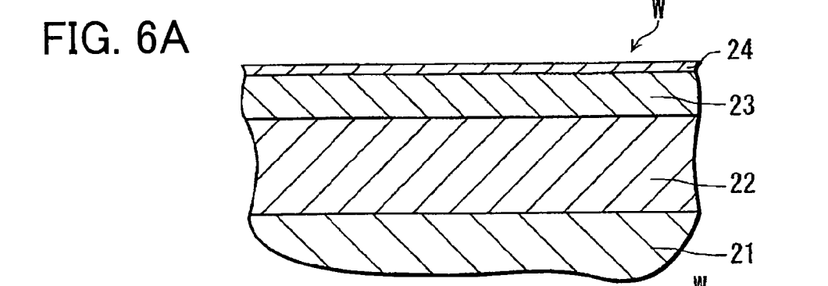
FIGS. 6A to 6E are process drawings showing a process of etching a silicon monoxide film and a silicon nitride film using hydrogen fluoride gas.

As shown in FIG. 5, first, the wafer W is transferred into the chamber 11 and mounted on the mounting stage 12 (step S51), and the mounted wafer W is heated by the heater 18 (step S52). At this time, the wafer W is heated to a temperature of not less than 60° C. and not more than 200° C., preferably, 80 to 120° C. At this time, the wafer W still has the silicon monoxide film 24 (FIG. 6A).

Figure 6B:
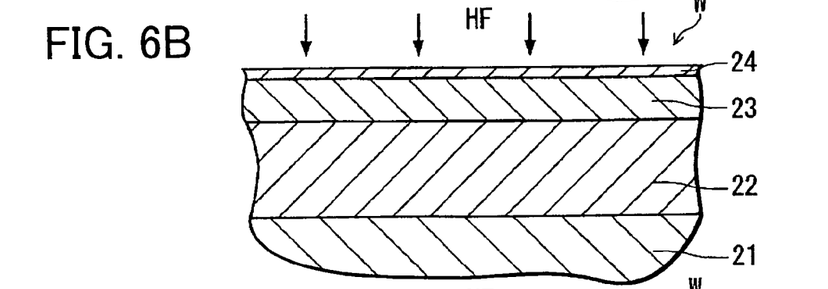
Figure 6C:
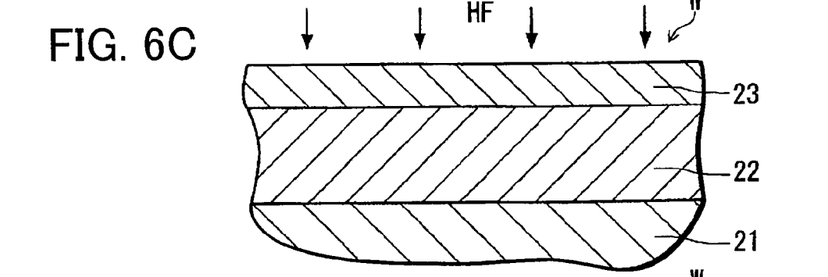
Figure 6D:
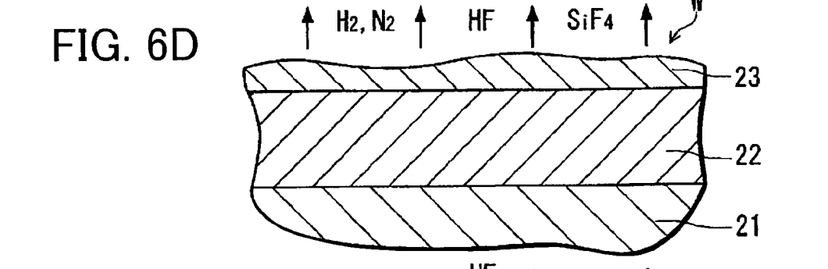
Figure 6E:
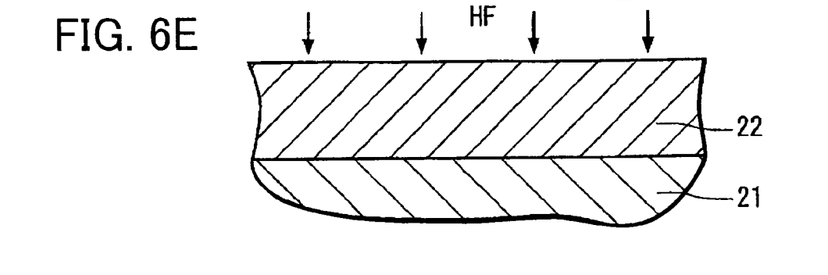

Next, hydrogen fluoride gas is supplied toward the wafer W from the shower head 13 (step S53) (FIG. 6B). At this time, energy such as radio frequency electrical power for turning the hydrogen fluoride gas into plasma is not applied into the chamber 11, and hence the hydrogen fluoride gas reaches the wafer W without turning into plasma. Then, the hydrogen fluoride gas having reached the silicon monoxide film 24 of the wafer W etches the silicon monoxide film 24 for 30 seconds. As a result, the silicon monoxide film 24 is removed, and the silicon nitride film 23 becomes exposed. The hydrogen fluoride gas reaches the exposed silicon nitride film 23 (FIG. 6C), combines with water molecules in the silicon nitride film 23 to make hydrofluoric acid, which in turn etches the silicon nitride film 23 as expressed by the above equations (1) to (3) (FIG. 6D). As a result, the silicon nitride film 23 is removed, and the thermally-oxidized silicon film 22 becomes exposed. Then, the hydrogen fluoride gas reaches the exposed thermally-oxidized silicon film 22 (FIG. 6E) but does not etch the thermally-oxidized silicon film 22 because the hydrogen fluoride gas does not make hydrofluoric acid as described above.

Then, it is determined whether or not the time period that has elapsed since the start of supply of the hydrogen fluoride gas is longer than a predetermined time period (step S54). If the elapsed time period is not longer than the predetermined time period, the process returns to the step S53, and if the elapsed time period is longer than the predetermined time period, the process is brought to an end. The predetermined time period in the step S54 is set to 30 seconds or more with consideration given to the time required for etching of the silicon monoxide film 24.

According to the process of FIG. 5, the wafer W having the thermally-oxidized silicon film 22, the silicon nitride film 23 formed on the thermally-oxidized silicon film 22, and the silicon monoxide film 24 formed on the silicon nitride film 23 is heated to a temperature of not less than 60° C. by the heater 18 of the mounting stage 12, and hydrogen fluoride gas is supplied toward the wafer W from the shower head 13. When the wafer W reaches a temperature of not less than 60° C., the silicon nitride film 23 is suddenly etched although the thermally-oxidized silicon film 22 is not etched by the hydrogen fluoride gas. Thus, the selective ratio of the silicon nitride film 23 to the thermally-oxidized silicon film 22 can be secured, and hence the silicon nitride film 23 can be removed without damaging the thermally-oxidized silicon film 22.

In the step S53 of FIG. 5, because the hydrogen fluoride gas supplied from the shower head 13 reaches the wafer W without turning into plasma, the thermally-oxidized silicon film 22 can be prevented from being damaged by plasma.

In the step S52 of FIG. 5, the temperature of the wafer W is maintained at 200° C. or less. When the temperature of the wafer W rises, the etch rate at which the silicon nitride film 23 is etched by the hydrogen fluoride gas decreases, and when the temperature of the wafer W reaches 200° C., the etch rate of the silicon nitride film 23 becomes nearly zero. Thus, the etch rate of the silicon nitride film 23 can be maintained at more than zero, and hence the selective ratio of the silicon nitride film 23 to the thermally-oxidized silicon film 22 can be reliably secured.

In the step S52 of FIG. 5, the wafer W is heated to a temperature of 80 to 120° C. When the wafer W reaches a temperature of not less than 60° C., the etch rate at which the silicon nitride film 23 is etched by the hydrogen fluoride gas suddenly changes, and hence it is difficult to control the etch rate when the temperature of the water W is in the vicinity of 60° C. On the other hand, when the temperature of the wafer W is 80 to 120° C., the etch rate of the silicon nitride film 23 only gradually changes. Thus, changes in the etch rate of the silicon nitride film 23 can be suppressed, and hence the etch rate of the silicon nitride film 23 can be easily controlled.

Moreover, in the process of FIG. 5, the hydrogen fluoride gas is supplied toward the wafer W for at least 30 seconds. Even when the wafer W is heated to a temperature of not less than 60° C., etching of the silicon nitride film 23 is not started until 30 seconds has elapsed since the wafer W contacted the hydrogen fluoride gas. Thus, by supplying the hydrogen fluoride gas toward the wafer W for at least 30 seconds, the silicon nitride film 23 can be reliably etched.

It should be noted in the above described embodiments, the substrates are not limited to being semiconductor wafers W, but rather may instead be glass substrates used in LCDs (Liquid Crystal Displays), FPDs (Flat Panel Displays) or the like.

It is to be understood that the object of the present invention may also be accomplished by supplying a system or an apparatus with a storage medium in which a program code of software, which realizes the functions of the above described embodiment is stored, and causing a computer (or CPU or MPU) of the system or apparatus to read out and execute the program code stored in the storage medium.

In this case, the program code itself read from the storage medium realizes the functions of the above described embodiment, and hence the program code and a storage medium on which the program code is stored constitute the present invention.

Examples of the storage medium for supplying the program code include a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program code may be downloaded to a computer from another computer, a database, or the like, not shown, connected to the Internet, a commercial network, a local area network, or the like.

Further, it is to be understood that the functions of the above described embodiment may be accomplished not only by executing a program code read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program may be an object code, a program executed by an interpreter, or script data supplied to an OS.

What is claimed is:

1. A substrate processing method of processing a substrate having at least a thermally-oxidized film and a silicon nitride film formed on the thermally-oxidized film, comprising:
   a heating step of heating the substrate to a temperature of not less than 80° C. and not more than 200° C.; and
   a gas supply step of supplying hydrogen fluoride gas toward the substrate so as to remove the silicon nitride film,
   wherein in said gas supply step, the hydrogen fluoride gas is supplied in a state in which the thermally-oxidized film and the silicon nitride film are present contemporaneously.

2. A substrate processing method as claimed in claim 1, wherein in said gas supply step, the supplied hydrogen fluoride gas reaches the substrate without turning into plasma.

3. A substrate processing method as claimed in claim 1, wherein in said heating step, the substrate is heated to a temperature of 80 to 120° C.

4. A substrate processing method as claimed in claim 1, wherein in said gas supply step, the hydrogen fluoride gas is supplied toward the substrate for at least 30 seconds.

5. A substrate processing method as claimed in claim 1, wherein a pressure in a housing chamber in which the substrate is housed is $4.00 \times 10^3$ Pa in said gas supply step.

6. A substrate processing method as claimed in claim 1, wherein a flow rate of supplied hydrogen fluoride gas is 3000 sccm in said gas supply step.

7. A substrate processing method as claimed in claim 1, wherein a silicon monoxide film is stacked on the silicon nitride film, and
   wherein both the silicon monoxide film and the silicon nitride film are removed in said gas supply step.

* * * * *